(12) United States Patent
Ghandehari et al.

(10) Patent No.: US 6,867,063 B1
(45) Date of Patent: Mar. 15, 2005

(54) ORGANIC SPIN-ON ANTI-REFLECTIVE COATING OVER INORGANIC ANTI-REFLECTIVE COATING

(75) Inventors: Kouros Ghandehari, Santa Clara, CA (US); Dawn Hopper, San Jose, CA (US); Wenmei Li, Sunnyvale, CA (US); Angela T. Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/262,221

(22) Filed: Sep. 30, 2002

(51) Int. Cl.[7] .............................................. H01L 21/02
(52) U.S. Cl. .............................. 438/72; 438/69; 438/82
(58) Field of Search ................................ 438/69, 72, 82

(56) References Cited

U.S. PATENT DOCUMENTS

| | | | | |
|---|---|---|---|---|
| 5,724,182 A | * | 3/1998 | Mitani et al. | 359/457 |
| 5,924,000 A | * | 7/1999 | Linliu | 438/592 |
| 6,258,713 B1 | * | 7/2001 | Yu et al. | 438/634 |
| 6,262,484 B1 | * | 7/2001 | Rangarajan et al. | 257/752 |
| 6,572,990 B1 | * | 6/2003 | Oyama et al. | 428/698 |
| 6,630,288 B2 | * | 10/2003 | Shields et al. | 430/313 |

FOREIGN PATENT DOCUMENTS

JP 2002124518 A * 4/2002 ........ H01L/21/3213

* cited by examiner

Primary Examiner—Allan R. Wilson

(57) ABSTRACT

A method of manufacturing a semiconductor. A conventional bottom anti-reflective coating is applied over a reflective surface, for example an inter-layer dielectric. A second anti-reflective coating is deposited over the first anti-reflective coating. The second anti-reflective coating is organic and may be deposited through a spin-on process. The organic anti-reflective coating may be deposited with more exacting optical properties and better control of the layer thickness than conventional bottom anti-reflective coatings applied via chemical vapor deposition processes. The combination of the two layers of anti-reflective materials, the materials having differing optical properties, demonstrates superior control of reflections from underlying materials compared with conventional art methods. More particularly, an organic anti-reflective coating in conjunction with an inorganic anti-reflective coating may cancel reflections across a wide range of thicknesses in an underlying dielectric layer. The superior anti-reflective structure of embodiments of the present invention allow patterning of semiconductor structures at smaller critical dimensions with greater accuracy, rendering competitive advantages in device speed, density and cost.

10 Claims, 10 Drawing Sheets

US 6,867,063 B1

ORGANIC SPIN-ON ANTI-REFLECTIVE COATING OVER INORGANIC ANTI-REFLECTIVE COATING

TECHNICAL FIELD

Embodiments of the present invention relate to design and manufacture of sub-micron metal oxide semiconductors. More particularly, embodiments of the present invention provide organic spin-on anti-reflective coating over inorganic anti-reflective coating.

BACKGROUND ART

The well known Moore's Law of the semiconductor field states that the number of semiconductor devices, e.g., transistors, per unit area will double every 18–24 months. While other factors such as design improvements contribute, one of the fundamental drivers of this inexorable density increase is the ever shrinking minimum feature size of semiconductors. For example, a common minimum feature size of modern semiconductors is 0.14 microns.

A modern integrated circuit, IC, for example a flash memory device, may have millions to hundreds of millions of devices made up of complex, multi-layered structures that are fabricated through hundreds of processing steps. Those structures, for example a gate stack, are formed by repeated deposition and patterning of thin films on a silicon substrate, also known as a wafer.

For example, a structure above the surface of a wafer may be formed by depositing polysilicon over the entire wafer, followed by the application of a photosensitive polymer layer, known as photoresist. The photoresist-covered wafer is exposed to a light source, usually a narrow band of ultraviolet light, for example, from a mercury lamp. A mask is used to shield portions of the wafer from the light, creating an exposure pattern on the wafer. The light energy changes the chemical nature of the photoresist. A developing solution is then used to remove the photoresist in the areas exposed to the light source. This sequence of steps is known as photolithography.

The pattern of remaining photoresist (which was the mask pattern) is then recreated in the underlying film (e.g., the layer of polysilicon) by etching away the material that is not protected by photoresist. In a subsequent processing step, the photoresist is chemically removed.

FIGS. 1A through 1D illustrate an exemplary photolithography to form a gate stack of a floating gate memory cell 10, as is well known in the conventional art. In FIG. 1A, tunnel oxide layer 112C has been grown by conventional means over wafer 110. Polysilicon layer 112B has been deposited over tunnel oxide layer 112C. Layer 112A, which may be an ONO stack, has been put in place, and polysilicon layer 112A has been deposited. Layer 116, which may be polysilicon, has further been deposited over layer 112A. Note that layers 112A, 112B, 112C and 116 cover large portions of wafer 110.

A layer of photoresist 120 is then deposited over the previously described layers. In FIG. 1B, light energy 140 is directed at photoresist layer 120. A mask structure 130 blocks some areas of photoresist layer 120 from receiving light energy 140.

In FIG. 1C, the photoresist has been developed. Areas of photoresist that received (were exposed to) the light energy 140 are removed by the developing process. Wafer 110 subsequently undergoes an etching process. As described previously, an etching process removes material where photoresist material is not present. After etching, and a subsequent removal of the remaining photoresist material, substantial portions of memory cell 10 are formed, as depicted in FIG. 1D. Memory cell 10 comprises a control gate 16, a floating gate 12B, and a tunnel oxide 12C.

The gate length, generally corresponding approximately with minimum feature size 18, is one of the most critical features of a Metal Oxide Semiconductor, MOS, device. For example, gate length generally determines the channel, e.g., channel region 17, length. When a field-effect transistor in a MOS device is in the "on" state, it conducts current between a drain and a source. The shorter the distance between a drain and a source, the shorter the distance that charge carriers, e.g., electrons or "holes," must travel. In general, charge carriers travel at a constant speed in a uniform material. (Speed may vary according to differing types of material and different types of charge carriers.) Therefore, a short channel produces a faster or higher speed transistor. Up to a certain point, which generally varies from design to design, shorter channels corresponding to faster transistors, are considered desirable. However, if a channel becomes too short, the device may suffer from what is known as the "short channel effect."

As channel length grows shorter, threshold voltage, the voltage required to turn on a transistor, begins to decrease and leakage current increases. These effects are commonly referred to in the semiconductor arts as the "short channel effect." An increase in leakage current is particularly onerous in flash memory devices as flash has found wide acceptance in very low power applications, for example mobile phones, due to the ability of flash to retain information without applied power. Increases in leakage current may have a significant deleterious effect on total power consumption of the flash device and the product using the flash device.

A well known problem with the photolithography process results from the highly reflective nature of the materials and surfaces of semiconductor devices. FIG. 2A illustrates a deleterious effect of reflective surfaces upon photolithography. Light energy 140 is directed through mask 130 into photoresist layer 120. Layer 290 may be almost any layer of a semiconductor device, for example a substrate. Top surface 210 of layer 290 is reflective to light energy 140. Incident light energy 140 is reflected from surface 210 back toward its origin, producing reflected light energy 241. Reflected light energy 241 interferes with incident light energy 140 to form a standing wave 230.

Unfortunately, standing wave 230 produces widely varying levels of light energy intensity within photoresist layer 120. In general, the light energy intensity within photoresist layer 120 will vary from zero to twice the level of the incident radiation. In regions of photoresist layer 120 receiving zero light energy, the desirable chemical changes in the polymer(s) comprising photoresist layer 120 do not occur. In regions of photoresist layer 120 receiving more light energy than is incident, damage may occur. In other regions, varying levels of chemical changes may occur corresponding to the varying levels of light energy received. As an unfortunate consequence, the photoresist material is not changed uniformly. After developing, portions of photoresist may remain in regions intended to be removed, resulting in incorrectly formed semiconductor structures. For example, a gate length may be unintentionally increased because of incomplete etching resulting from such standing waves.

FIG. 2B illustrates one well known solution to the problem of standing waves. Layer 220 is applied over reflective surface 210 prior to the application of photoresist layer 120. Through careful control of the optical properties and thickness of layer 220, reflections from reflective surface 210 can be eliminated prior to having a deleterious effect within photoresist layer 120. Layer 220, applied at the bottom of photoresist layer 120 is known as a Bottom Anti-Reflective Coating, or BARC. A conventional BARC is typically a silicon oxynitride, $SiN_xO_y$, and is deposited by chemical vapor deposition (CVD). BARCs are also formed from silicon-rich nitride, $Si_xN_y$.

An inter-layer dielectric (ILD) layer is a layer of dielectric (insulator) material placed between adjacent layers of interconnect metalization in a semiconductor process using multiple metal layers for interconnection. ILD thickness may typically be 6000 angstroms and vary by plus or minus 1500 angstroms. Unfortunately, it is typically not possible to completely isolate variation in reflectivity at the boundary between resist and substrate from the high variation in the thickness of an inter-layer dielectric (ILD) by the use of a single absorbing anti-reflective coating. One reason for this is that the contact dielectric does not absorb any of the incident light energy. In other words, it has a purely real index of refraction. The anti-reflective coatings conventionally deposited over the ILD typically have a complex index of refraction.

Reflectivity at an interface (normal incidence) is given by the relation:

$$R = \left| \frac{\tilde{n}_1 - \tilde{n}_2}{\tilde{n}_1 + \tilde{n}_2} \right|^2 \quad \text{(relation 1)}$$

Where n is the refractive index (real) of a material and k is the coefficient of extinction (complex) of a material. By definition, $\bar{n}_1 = n_1 + ik_1$ is the complex index of refraction for material 1, where n is the refractive index (real) of a material and k is the coefficient of extinction (complex) of a material. In this example, material 1 ($\bar{n}_1$) has a non-zero complex portion. Consequently, if material 2 has a purely real index of refraction, then the modulus of $\bar{n}_1 - \bar{n}_2$ can never be identically zero, and the reflectivity can not be zero. Consequently, an anti-reflective coating, typically with a complex index of refraction, can not completely cancel reflections from a reflective material with a real index of refraction, for example a dielectric or damascene metal.

Semiconductor processing equipment is extremely expensive. Fundamental semiconductor processing steps, e.g., implantation, diffusion and etching, typically require long periods of development and extensive qualification testing. Implementing a new fabrication process requires considerable resources on the part of the semiconductor manufacturer. A manufacturer may have to alter or entirely revamp process libraries and process flows in order to implement a new fabrication process. Additionally, re-tooling a fabrication line is very expensive, both in terms of direct expenses as well as in terms of opportunity cost due to the time required to perform the re-tooling. Consequently, any solution to standing waves within photoresist should be compatible with existing semiconductor processes and equipment without the need for revamping well established tools and techniques.

Accordingly, a need exists to reduce standing waves within photoresist. A further need exists for reducing standing waves within photoresist over an inter-layer dielectric. A still further need exists for the above mentioned needs to be achieved with existing semiconductor processes and equipment without revamping well established tools and techniques.

DISCLOSURE OF THE INVENTION

Embodiments of the present invention provide a means to reduce standing waves within photoresist. Further embodiments of the present invention provide for reducing standing waves within photoresist over an inter-layer dielectric. Still further embodiments of the present invention provide for the above mentioned solutions to be achieved with existing semiconductor processes and equipment without revamping well established tools and techniques.

A method of manufacturing a semiconductor is disclosed. A conventional bottom anti-reflective coating is applied over a reflective surface, for example a inter-layer dielectric. A second anti-reflective coating is deposited over the first anti-reflective coating. The second anti-reflective coating is organic and may be deposited through a spin-on process. The organic anti-reflective coating may be deposited with more exacting optical properties and better control of the layer thickness than conventional bottom anti-reflective coatings applied via chemical vapor deposition processes. The combination of the two layers of anti-reflective materials, the materials having differing optical properties, demonstrates superior control of reflections from underlying materials compared with conventional art methods. More particularly, an organic anti-reflective coating in conjunction with an inorganic anti-reflective coating may cancel reflections across a wide range of thicknesses in an underlying dielectric layer. The superior anti-reflective structure of embodiments of the present invention allow patterning of semiconductor structures at smaller critical dimensions with greater accuracy, rendering competitive advantages in device speed, density and cost.

BEST MODE FOR CARRYING OUT THE INVENTION

In the following detailed description of the present invention, organic spin-on anti-reflective coating over inorganic anti-reflective coating, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

Embodiments of the present invention are described in the context of design and manufacture of flash memory devices. However, it is appreciated that embodiments of the present invention may be utilized in other areas of electronic design and operation.

Figure 1A:
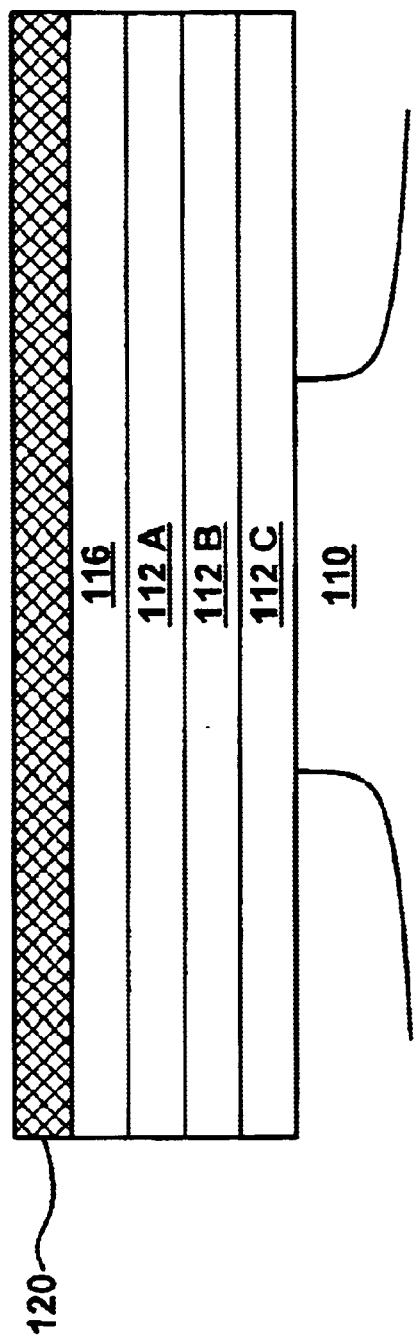
FIGS. 1A, 1B, 1C and 1D illustrate an exemplary photolithography to form a gate stack of a floating gate memory cell, as is well known in the conventional art.
Figure 1B:
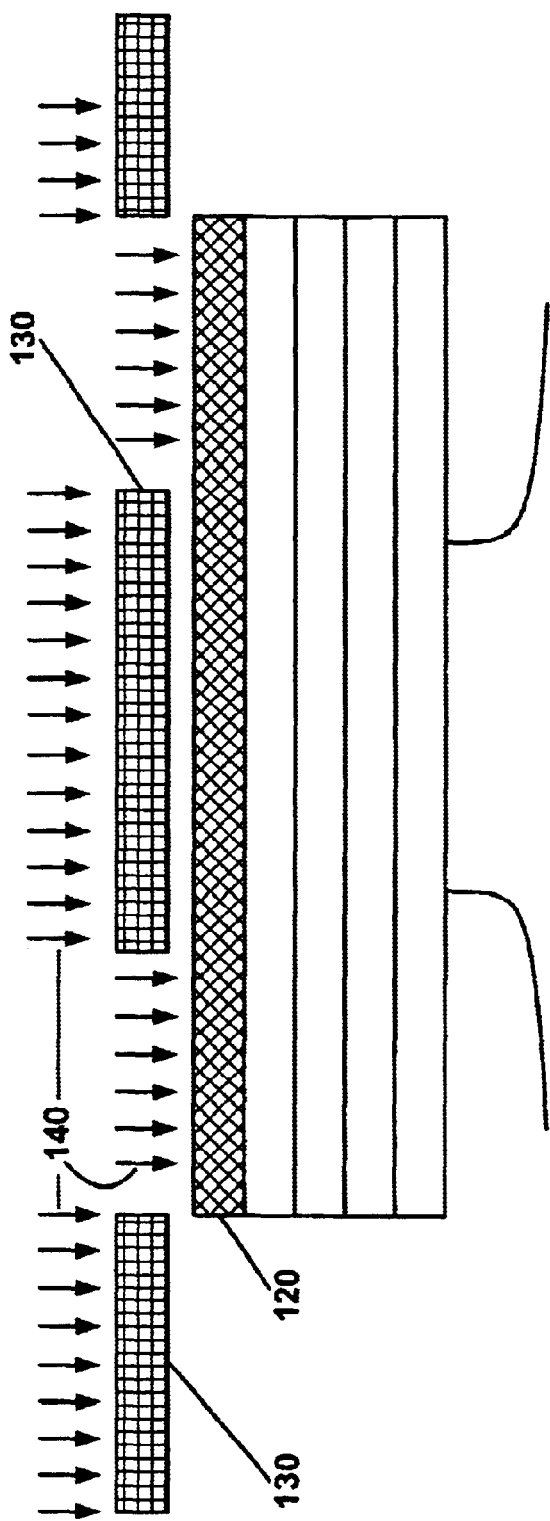
Figure 1C:
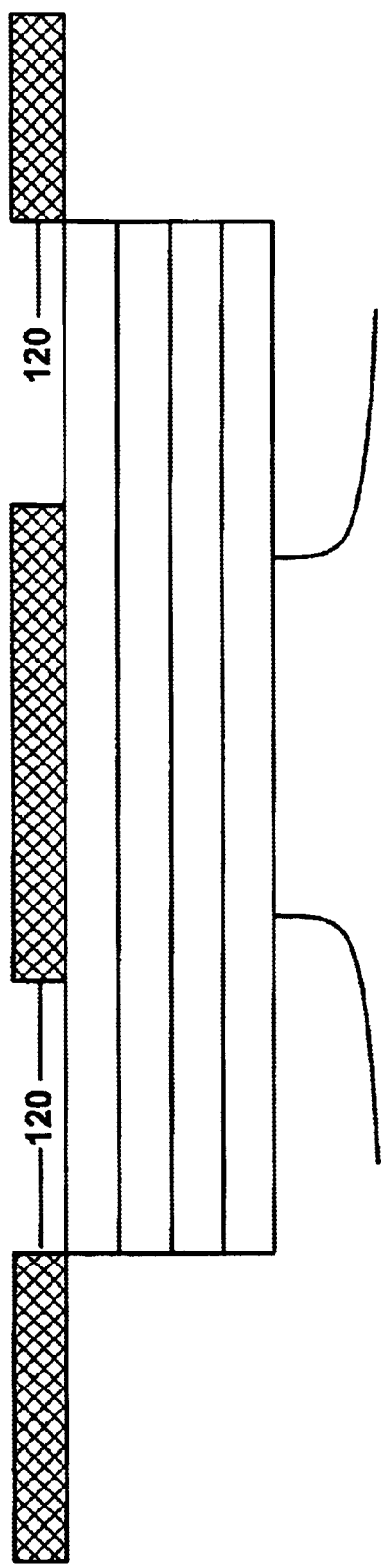
Figure 1D:
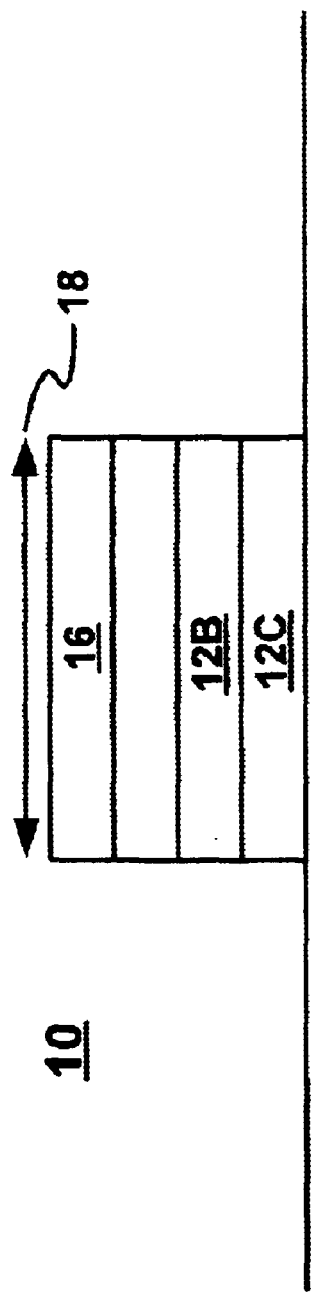
Figure 2A:
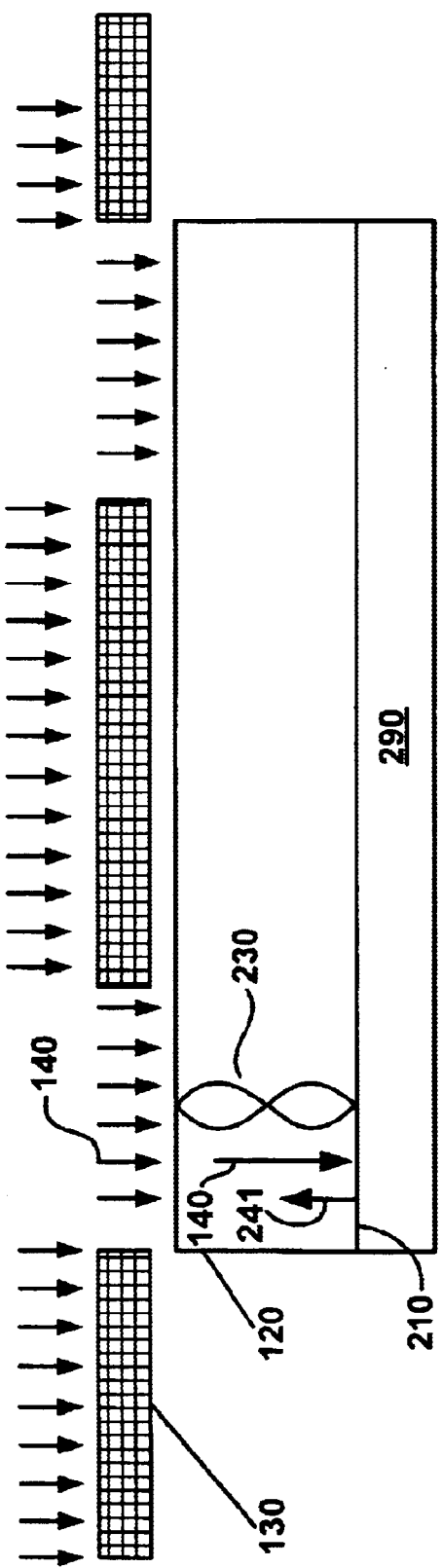
FIG. 2A illustrates a deleterious effect of reflective surfaces upon photolithography.
Figure 2B:
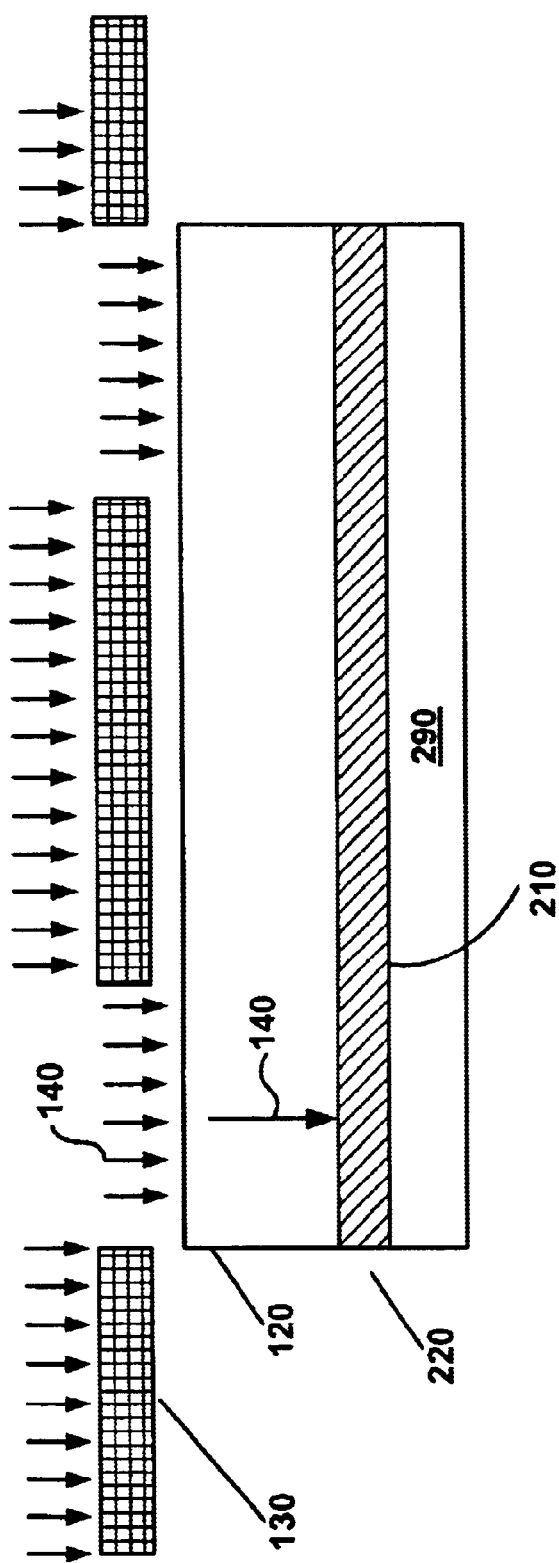
FIG. 2B illustrates one well known solution to the problem of standing waves.
Figure 3:
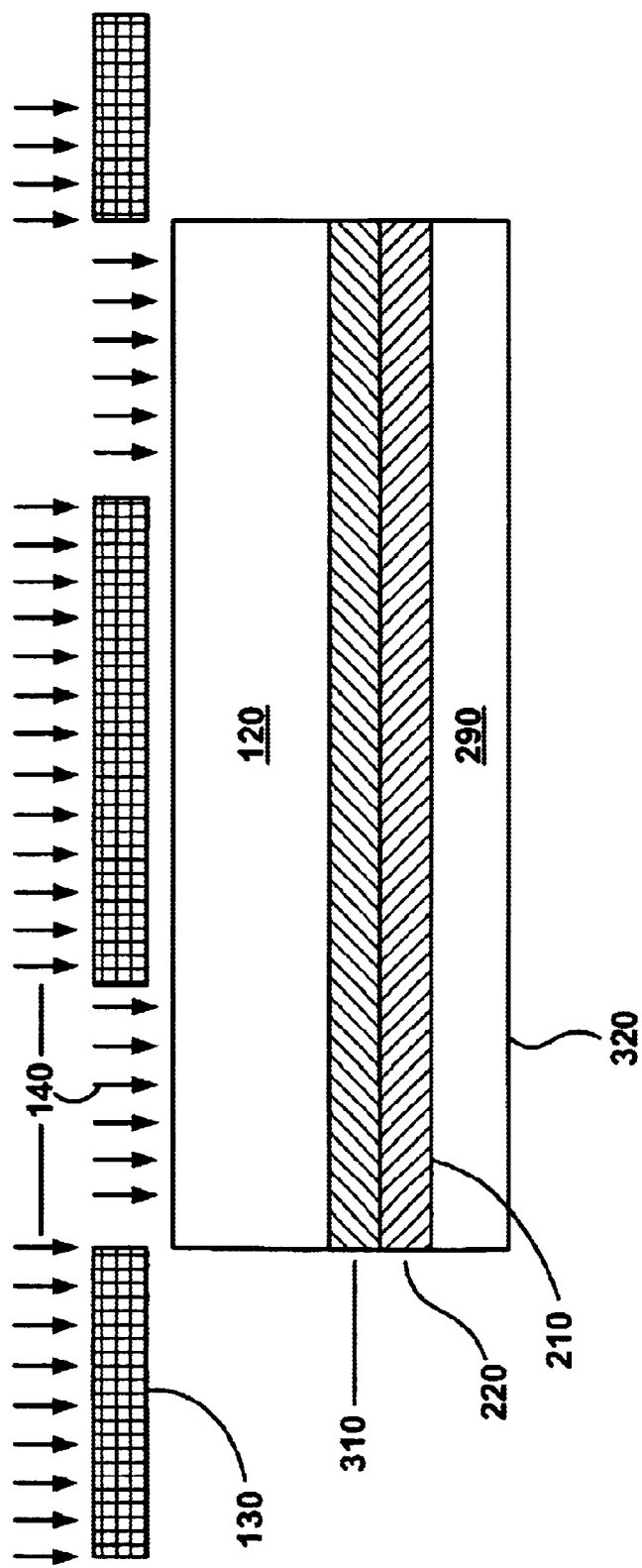
FIG. 3 illustrates a semiconductor structure to control reflections, according to an embodiment of the present invention.

FIG. 3 illustrates a semiconductor structure to control reflections, according to an embodiment of the present invention. Light energy 140 is directed through mask 130 into photoresist layer 120. Layer 290 may be a reflective layer of semiconductor material, for example an inter-layer dielectric or a layer of damascene metal. Top surface 210 of layer 290 is reflective to light energy 140. It is to be appreciated that reflection of light energy may also occur from bottom surface 320 of layer 290, or elsewhere within layer 290. Incident light energy 140 is reflected back toward its origin.

Layer 220 is a conventional bottom anti-reflective coating, BARC. Layer 220 is typically inorganic, for example silicon oxynitride, and applied via chemical vapor deposition (CVD). Due to the deposition method, it is difficult to control both the optical characteristics and the thickness of layer 220. The variability of optical properties places great demands for precision in the layer thickness. Unfortunately, the thickness tolerance of layer 220, deposited by chemical vapor deposition processes, required to compensate for the optical variability of the material is typically not commercially feasible. An additional deleterious effect of conventional inorganic BARCs is known as "resist poisoning" or "footing." For some desirable conventional compositions of photoresist, residual nitrogen from the silicon oxynitride, for example BARC layer 220, contaminates the photoresist material. Such contamination may cause numerous ill effects, including, for example, blocking of light energy and/or difficulty in removing the contaminated resist material.

Layer 310 illustrates a novel second layer of anti-reflective material, according to an embodiment of the present invention. Layer 310 is an organic material, for example Shipley AR-3, commercially available from Shipley Company of Marlborough, Mass., applied as a second layer of anti-reflective material over a first layer of anti-reflective material, for example anti-reflective coating layer 220. The index of refraction for an organic anti-reflective material is typically lower than the index of refraction for an inorganic anti-reflective material. For example, an organic anti-reflective material may have an index of refraction n=1.4, while an inorganic anti-reflective material may have an index of refraction n=2. The index of refraction has an inverse relationship with the ability to absorb reflections passing through varyingly thick under layers. For example, a material with an index of refraction of 1.4 is better able to compensate for variations in the thickness of an underlying layer than a material with an index of refraction of 2.0.

Layer 310 may be applied via a spin-on process. In general, a spin-on process is more desirable than chemical vapor deposition, as less costly equipment is required and the thickness of a spun-on coating may generally be controlled with greater precision than with chemical vapor deposition.

Further, because organic anti-reflective material does not contain nitrogen, the use of layer 310 adjacent to photoresist layer 120 advantageously eliminates the nitrogen poisoning of a resist layer.

In addition, because layer 310 is applied as a preexisting product, as opposed to being "formed as used" via chemical vapor deposition, the optical properties of layer 310 may be extremely consistent. As a beneficial result, because optical properties of organic anti-reflective coatings are so consistent, layer 310 may have greater tolerance in required thickness for a desired reduction in reflectivity. As noted above, the spin-on process has greater accuracy in application thickness. When combined with the greater latitude in required thickness, the accuracy of application results in a very wide process window, which in turn results in higher manufacturing quality and lower defect rates.

As a beneficial consequence of the novel combination of an organic anti-reflective coating over an inorganic anti-reflective coating, reflections may be advantageously reduced or eliminated over a wide range of thicknesses for an underlying layer. Further, the use of an organic anti-reflective coating adjacent to a photoresist layer advantageously eliminates nitrogen poisoning of a photoresist that might otherwise have occurred if the photoresist was applied directly over an inorganic anti-reflective coating.

Figure 4:
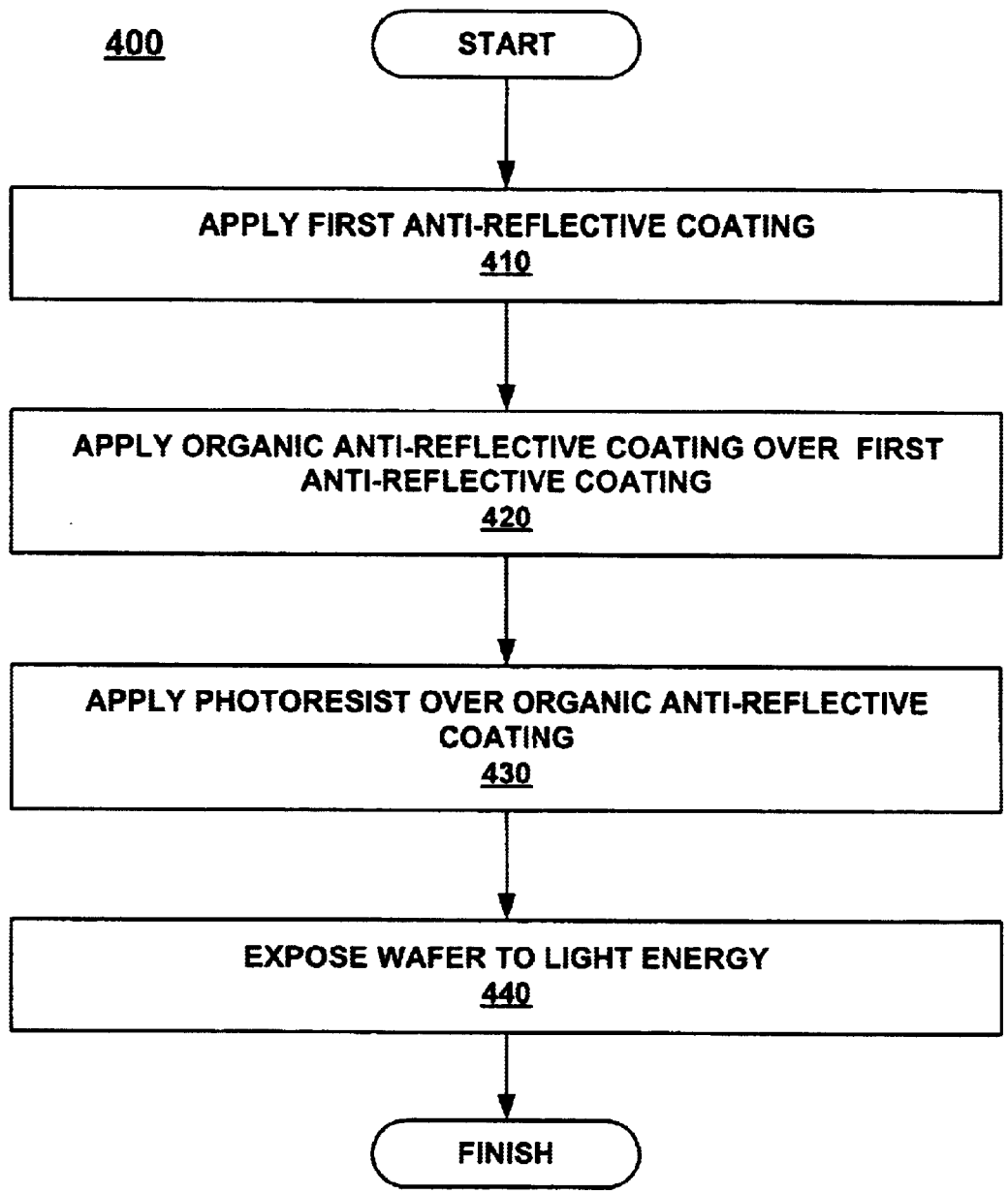
FIG. 4 illustrates a flow chart for a method of manufacturing a semiconductor, according to an embodiment of the present invention.

FIG. 4 illustrates a flow chart for a method 400 of manufacturing a semiconductor, according to an embodiment of the present invention.

In step 410, a first anti-reflective coating is applied over a reflective semiconductor structure. The first anti-reflective coating may be conventional silicon oxynitride or other silicon-rich nitride, and is typically applied via chemical vapor deposition processes.

In step 420, an organic anti-reflective coating is deposited over the first antireflective coating. The organic anti-reflective coating may be deposited via a spin-n process.

In optional step 430, a photoresist material may be applied over the organic anti-reflective coating.

In step 440, a wafer comprising the reflective structure, the first anti-reflective coating and the organic anti-reflective coating is exposed to patterning energy of photolithography. In this novel manner, reflected light energy of photolithography may be eliminated prior to being reflected into a photoresist material. In so doing, the patterning characteristics of the photolithographic process are optimized.

The formulas describing reflectivity of a surface with multiple layers are well known, for example being published in "Optical Properties of Thin Solid Films" by O. S. Heavens, published by Butterworths Scientific Publications, London (1955). The optical properties of a set of materials which will produce optimum reflective conditions (e.g., minimizing reflections) are usually determined by simulation rather than directly solving a set of relations-involving complex variables.

Each layer "n" is represented by a matrix describing the path length of the radiation in the material of layer "n" and the Fresnel coefficient for the interface between layer "n" and layer "n+1." These relations allow the reflectivity of a stack of materials to be determined by computing a matrix product for each layer. The total reflectivity of the stack of layers is determined by computing the ration of the square modulus of two entries in the final matrix.

Figure 5:
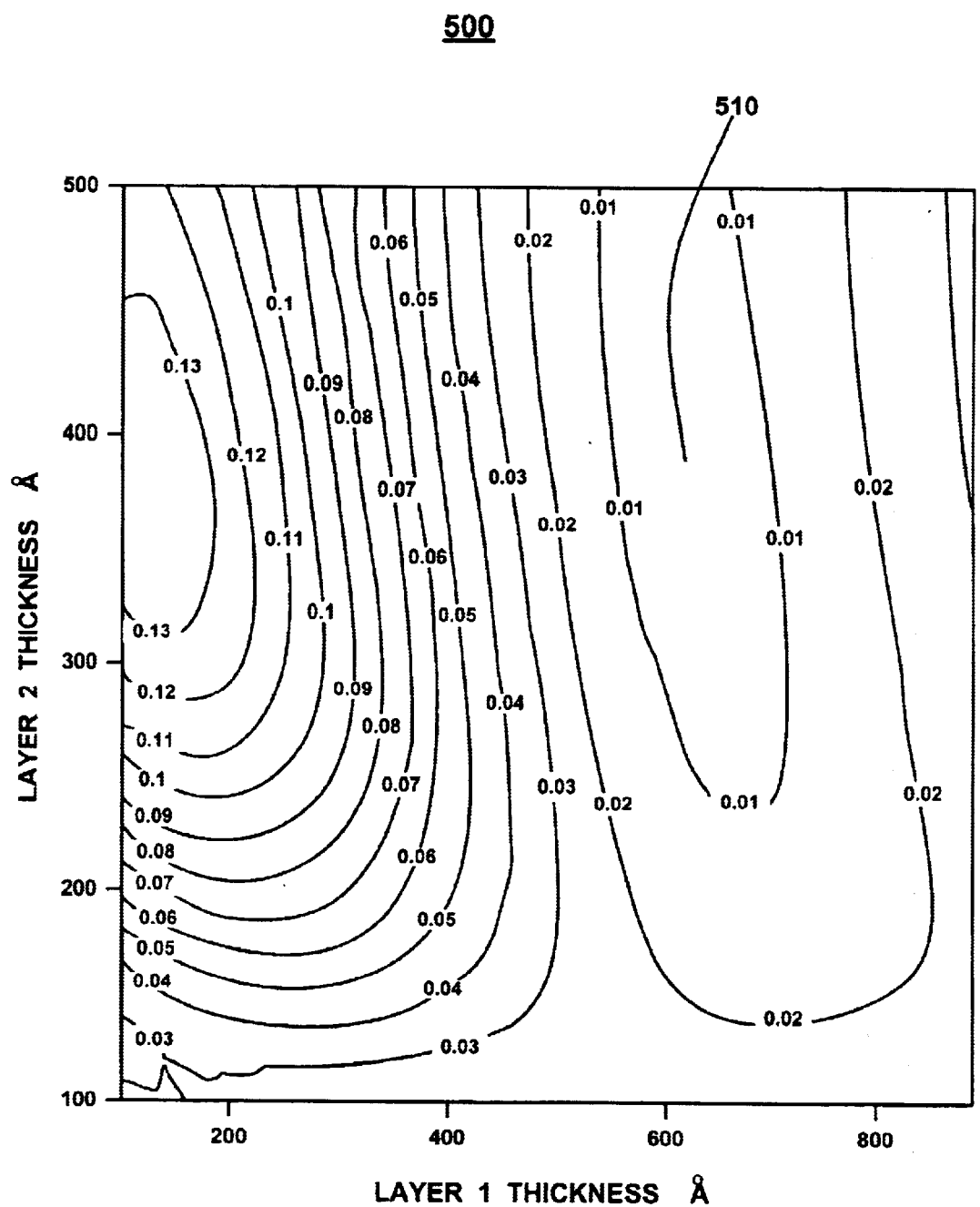
FIG. 5 shows a contour plot of reflectivity for variations in thickness of a two-layer anti-reflective treatment, according to an embodiment of the present invention.
Figure 6:
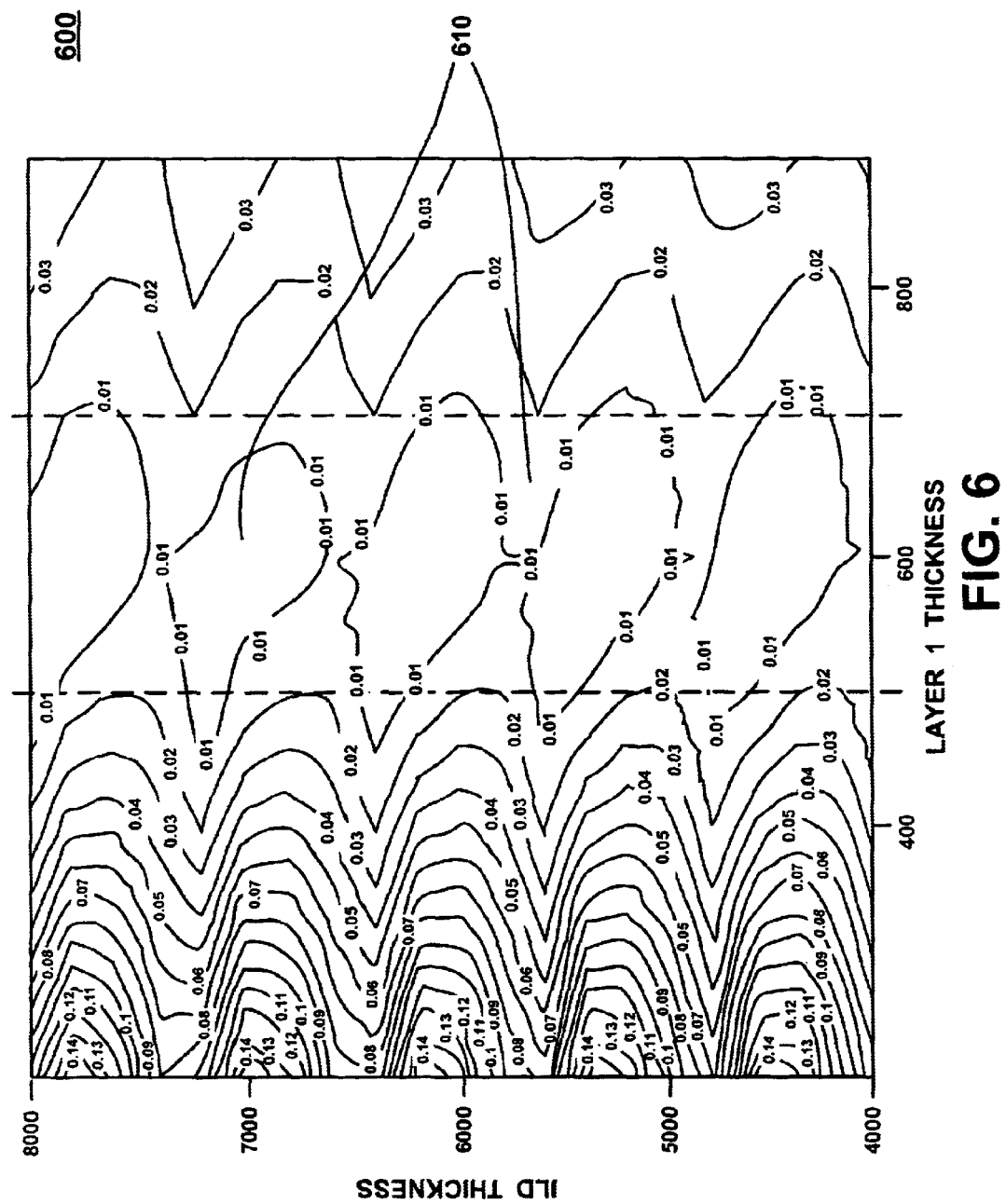
FIG. 6 shows a contour plot of reflectivity for variations in thickness for the top organic layer of a two-layer anti-reflective treatment versus the thickness of an inter-layer dielectric, according to an embodiment of the present invention.

FIGS. 5 and 6 illustrate simulation plots of reflectivity over a reflective layer of a semiconductor, for example a damascene metal layer, according to an embodiment of the present invention.

FIG. 5 shows a contour plot 500 of reflectivity for variations in thickness of a two-layer anti-reflective treatment, according to an embodiment of the present invention. The Y axis plots thickness of a "layer 2" inorganic anti-reflective coating, in angstroms. More specifically, layer two as plotted comprises a "high k Cl" SiON anti-reflective coating, with n=2.175 and k=1.16 applied via chemical vapor deposition. This layer may correspond to layer 220 of FIG. 3. The X axis of plot 550 plots thickness of a "layer 1" organic anti-reflective coating, also in angstroms. More specifically, layer one as plotted comprises a Shipley AR2 anti-reflective coating, with n=1.47 and k=0.42 applied via a spin-on process. This layer may correspond to layer 310 of FIG. 3. The contours of plot 500 show equal ratios of reflectivity (no units). For example, a reflectivity of 0.01 means that 1 percent of the light energy incident at the top of layer 1 is reflected back through the top surface of layer 1.

Region 510 of plot 500 describes a combination of thicknesses of the two materials which produce very little reflection. More specifically, for a "layer 1" (organic) thickness of about 300 angstroms and a "layer 2" (inorganic) thickness of about 670 angstroms, plot 500 indicates that the reflection should be less than about one percent of the incident light.

Advantageously, region 510 has a substantial vertical extent, indicating that this level of very low reflectivity may be achieved for wide variations in "layer 2" or inorganic anti-reflective coating thickness. As described previously, it is difficult to precisely control the thickness of the inorganic anti-reflective coatings applied via chemical vapor deposition (CVD). Region 510 may be viewed as a large "process window" in which variations in CVD application thickness may be accommodated.

FIG. 6 shows a contour plot 600 of reflectivity for variations in thickness for the top organic layer of a two-layer anti-reflective treatment versus the thickness of an inter-layer dielectric, according to an embodiment of the present invention. The Y axis plots thickness of an inter-layer dielectric, for example $SiO_2$, in angstroms. This layer may correspond to layer 290 of FIG. 3. The X axis of plot 600 plots thickness of a "layer 1"organic anti-reflective coating, as part of a two-layer anti-reflective treatment, also in angstroms. More specifically, layer one as plotted comprises a Shipley AR2 anti-reflective coating, with n 1.47 and k=0.42 applied via a spin-on process. This layer may correspond to layer 310 of FIG. 3. An inorganic anti-reflective coating 300 angstroms thick is applied between the inter-layer dielectric (ILD) (Y axis) and the organic anti-reflective coating (X axis). The contours of plot 600 show equal ratios of reflectivity (no units). For example, a reflectivity of 0.01 means that 1 percent of the light energy incident at the top of layer 1 is reflected back through the top surface of layer 1.

Region 610, demarked by dashed lines, of plot 600 describes a combination of thicknesses of the two layers which produce very little reflection. More specifically, for a "layer 1" (organic) thickness of between about 500 and 700 angstroms, plot 500 indicates that the reflection for all plotted thickness of inter-layer dielectric should be less than about two percent of the incident light.

Beneficially, region 610 has a substantial vertical extent, indicating that this level of very low reflectivity may be achieved for wide variations in inter-layer dielectric thickness. As described previously, it is difficult to precisely control the inter-layer dielectric thickness. Region 610 may be viewed as a large "process window" in which variations in ILD thickness may be accommodated.

Advantageously, semiconductors manufactured using embodiments of the present invention may utilize smaller process feature sizes, resulting in denser arrays of semiconductor devices, resulting in lower costs for such devices and realizing a competitive advantage to practitioners of the improvements in the arts herein described.

It is to be appreciated that simulations of reflectivity may be presented in numerous ways, and that the foregoing discussion is not intended to limit embodiments of the present invention to a single presentation mode.

Embodiments of the present invention provide a means to reduce standing waves within photoresist. Further embodiments of the present invention provide for reducing standing waves within photoresist over an inter-layer dielectric. Still further embodiments of the present invention provide for the above mentioned solutions to be achieved with existing semiconductor processes and equipment without revamping well established tools and techniques.

The preferred embodiment of the present invention, organic spin-on anti-reflective coating over inorganic anti-reflective coating, is thus described. While the present invention has been described in particular embodiments, it should be appreciated that the present invention should not be construed as limited by such embodiments, but rather construed according to the below claims.

What is claimed is:

1. A method of manufacturing a semiconductor comprising:

applying a first anti-reflective coating on a dielectric feature of a wafer;

depositing an organic anti-reflective coating over said first antireflective coating; and applying a photoresist material over said organic antireflective coating;

exposing said wafer to patterning energy of photolithography.

2. The method of manufacturing a semiconductor as described in claim 1 wherein said depositing comprises a spin on process.

3. The method of manufacturing a semiconductor as described in claim 1 wherein said first antireflective coating is inorganic.

4. The method of manufacturing a semiconductor as described in claim 1 wherein said first antireflective coating is applied over a damascene metal feature of said wafer.

5. The method of manufacturing a semiconductor as described in claim 1 wherein said applying comprises a chemical deposition process.

6. The method of manufacturing a semiconductor as described in claim 1 wherein said semiconductor comprises a non-volatile memory cell.

7. The method of manufacturing a semiconductor as described in claim 6 wherein said non-volatile memory cell comprises a floating gate.

8. The method of manufacturing a semiconductor as described in claim 6 wherein said non-volatile memory cell comprises a nitride layer as a storage element.

9. The method of manufacturing a semiconductor as described in claim 1 wherein the index of refraction of said first anti-reflective coating is greater than the index of refraction of said organic anti-reflective coating.

10. A method of manufacturing a semiconductor comprising:

applying an inorganic coating on a dielectric feature of a wafer;

depositing an organic anti-reflective coating over said inorganic coating; and covering said organic anti-reflective coating with a photoresist layer.

* * * * *